(12) United States Patent
Bykanov et al.

(10) Patent No.: US 7,741,626 B2
(45) Date of Patent: Jun. 22, 2010

(54) SPECTRAL PURITY FILTERS AND METHODS THEREFOR

(75) Inventors: Alexander N. Bykanov, San Diego, CA (US); Igor V. Fomenkov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 148 days.

(21) Appl. No.: 12/210,012

(22) Filed: Sep. 12, 2008

(65) Prior Publication Data

US 2010/0066989 A1    Mar. 18, 2010

(51) Int. Cl.
*G03B 27/42* (2006.01)
*G03B 27/72* (2006.01)
*F21V 9/06* (2006.01)

(52) U.S. Cl. ............... 250/504 R; 250/365; 250/372; 250/482.1; 355/71; 359/361

(58) Field of Classification Search ............... 250/372, 250/365, 363.1, 361 R, 461.1, 482.1, 487.1; 355/71–77; 359/360, 361
See application file for complete search history.

(56) References Cited

U.S. PATENT DOCUMENTS

| 5,414,489 | A * | 5/1995 | Kaplan ..................... 355/67 |
| 7,088,431 | B2 * | 8/2006 | Ottens et al. ............... 355/75 |
| 7,211,810 | B2 * | 5/2007 | Bakker et al. .......... 250/492.1 |
| 7,248,670 | B2 * | 7/2007 | Hoghoj et al. ............. 378/84 |
| 2005/0117239 | A1 * | 6/2005 | Hoghoj et al. ............ 359/883 |
| 2005/0134828 | A1 * | 6/2005 | Ottens et al. ............... 355/75 |
| 2006/0138354 | A1 * | 6/2006 | Bakker et al. ......... 250/492.21 |

* cited by examiner

*Primary Examiner*—Bernard E Souw

(57) ABSTRACT

A spectral purity filter arrangement is disclosed. The spectral purity filter arrangement includes a film configured for filtering out at least a portion of input light and a support structure coupled to the film along at least one edge of the film. The spectral purity filter arrangement further includes a gas control subsystem configured to direct a gas at the film to support the film at least when the film is disposed in an operational position to perform the filtering.

20 Claims, 4 Drawing Sheets

SPECTRAL PURITY FILTERS AND METHODS THEREFOR

BACKGROUND OF THE INVENTION

Spectral purity filters have long been employed in UV (ultra-violet) lithography systems that are designed for integrated circuit (IC) fabrication. In certain UV lithography systems (which, as the term is employed herein, also includes deep UV or extreme UV lithography systems), one or more spectral purity filters may be employed to filter out out-of-band radiation (i.e., light that is outside of the range of wavelengths of interest).

Although the examples herein discuss UV light, it should be understood that a spectral purity filter may be designed to filter out light of any wavelength, ranging from UV to infrared (IR) for example. In a typical example, a spectral purity filter may be created using a thin-film filter made of a material that permits light of certain wavelengths to pass through while blocking light of other wavelengths. Example materials that may be employed for such spectral purity filters (for 13.5 nm central wavelength) include, for example, Zirconium (Zr) and Silicon (Si).

One of the more important considerations in the design of a spectral purity filter is transmission efficiency. All things being equal, a spectral purity filter that permits more of the in-band radiation (i.e., light that is in the range of wavelengths of interest) to pass through is more desirable than a spectral purity filter that blocks more of the in-band radiation.

Due to the thinness of the thin film material with which spectral purity filters are fabricated, mechanical support is also a critical design consideration. For horizontally disposed spectral purity filters, for example, it has been estimated that the limited inherent strength of the spectral purity filter material limits the filter size to a few (such as 10-12) square millimeters.

To construct a larger spectral purity filter, mechanical support structures have been proposed. In a prior art configuration, a spectral purity filter may be disposed in a frame that is made of a suitable supporting material, such as metal or some form of composite material. The frame provides mechanical strength around the periphery of the spectral purity filter.

Further, a mesh may be attached to the frame such that the thin film material of the spectral purity filter may be supported by the mesh material. The openings in the mesh would allow light that is within the range of wavelengths of interest (i.e., in-band radiation) to pass through. By using a mesh to support the thin film material, it is possible to create a larger spectral purity filter out of an inherently fragile thin film.

However, the presence of the mesh material reduces the transmission efficiency of the spectral purity filter assembly. As discussed, in-band radiation may pass through the openings in the mesh of a spectral purity filter that is mesh-supported. However, a non-trivial portion of the in-band radiation is blocked by the mesh material itself. This blockage reduces transmission efficiency and is thus undesirable.

SUMMARY OF INVENTION

The invention relates, in an embodiment, to a spectral purity filter arrangement that includes a film configured for filtering out at least a portion of input light and a support structure coupled to the film along at least one edge of the film. The spectral purity filter arrangement further includes at least a first gas port configured to provide gas flow support for the film at least when the film is disposed in an operational position to perform the filtering.

In another embodiment, the invention relates to a method for implementing spectral purity filtering in a lithography system. The method includes providing a spectral purity filter arrangement that includes providing a film and a support structure, the film configured for filtering out at least a portion of input light and coupled to the support structure along at least one edge of the film. The method further includes providing gas flow support for the film at least when the film is disposed in an operational position to perform the filtering.

In yet another embodiment, the invention relates to an ultraviolet (UV) lithography system configured for processing substrates. The UV lithography system includes a spectral purity filter film configured for filtering out at least a portion of input light and a support structure coupled to the spectral purity filter film along at least one edge of the spectral purity filter film. The UV lithography system also includes means for providing a gas to create gas flow support for the spectral purity filter film at least when the spectral purity filter film is disposed in an operational position 10 perform the filtering.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
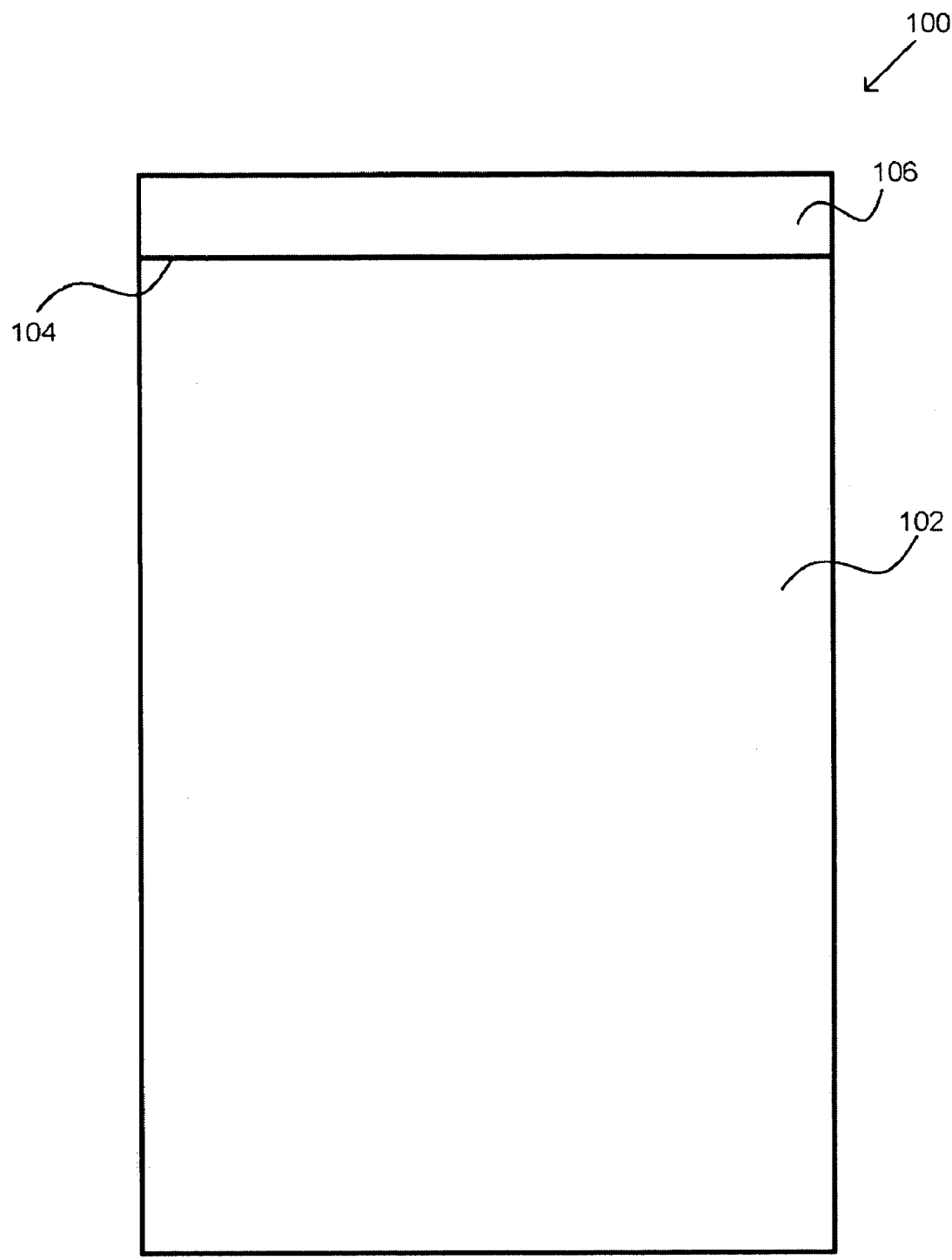
FIG. 1 shows, in accordance with an embodiment of the present invention, a spectral purity filter having a thin film and a support structure.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to avoid unnecessarily obscuring the present invention.

One or more embodiments of the invention relate to spectral purity filters for use in lithography systems. In an embodiment, a spectral purity filter having one edge attached to a supporting member is proposed. During use, gas flow, and preferably laminar gas flow, is furnished to provide gas flow support for the spectral purity filter and to counteract gravity. By way of example, hydrogen is often present in EUV lithography systems and may be employed to provide gas flow support for the thin film material of the spectral purity filter.

As the term is employed herein, gas flow support refers to the support for the film that otherwise would not exist in the absence of such gas flow. Within this broad definition, the support itself may be accomplished by any number of gas ports (such as a single gas port or multiple gas ports) directed at or along or across one or both surfaces of the film. Furthermore, the direction and/or volume and/or velocity of the gas exiting each port may be the same or may differ as desired.

By using a gas flow to support the spectral purity filter, support is provided more evenly for the thin film. This is in contrast to the mesh approach, whereby the thin film is supported mostly in the vicinity of the mesh, necessitating small mesh openings (and concomitantly a greater ratio of mesh vs. transmittance area) to support the fragile thin film material. In an embodiment, no mesh material in employed in the area of the thin film that is employed for filtering purposes, thereby maximizing transmittance efficiency.

In one or more embodiments, the gas flow is substantially parallel to the thin film surface. In one or more other embodiments, the gas flow may be directed at an angle to the thin film to achieve proper gas flow support to maintain the spectral purity filter at the desired operational position. In one or more embodiments, different gas volumes and/or velocities may be employed at different points and/or on different sides of the thin film to achieve proper and stable gas flow support for the thin film.

In one or more embodiments, the remaining edges of the spectral purity filters are unsupported. In this configuration, there are no structures interrupting the laminar gas flow along the thin film surfaces). In one or more embodiments, one or both of the edges that are parallel to the gas flow may be attached to one or more supporting members to stiffen the thin film. Since the gas flow is parallel to the edge supporting members, there are also no structures in the gas flow path that may disrupt the laminar flow even though additional stiffness is achieved.

In one or more embodiments, the supporting member that is attached to the thin film is a relatively inflexible supporting member that is capable of providing mechanical strength to permit coupling of the spectral purity filter to the rest of the lithography system. A flexible connecting member, such as a Mylar® film, may optionally be coupled between the inflexible supporting member and the more fragile thin film material. By providing a flexible connecting member, stress fractures due to, for example, vibration or other forms of mechanical stress may be reduced during use.

In one or more embodiments, a start-up procedure may be provided. The spectral purity filter may initially rest in a vertical direction and may be supported by gravity. As part of the start-up procedure, gas flow may be gradually provided and may be varied in volume and/or velocity and/or direction to smoothly rotate the thin film to a more horizontal position. The gas flow may be provided in gradually increasing volumes and/or velocities and/or direction to avoid blasting the thin film with a sudden blast of gas. In an embodiment, a mechanical rotating arrangement (such as a motor) may be provided, alternatively or additionally, to assist the cantilevered thin film to rotate to the operational position, which may be more horizontal.

The features and advantages of various embodiments of the present invention may be better understood with reference to the figures and discussions that follow. FIG. 1 shows, in accordance with an embodiment of the present invention, a spectral purity filter 100 having a thin film 102. Thin film 102 is attached along one edge 104 to a support structure 106. For discussion purpose, edge 104 of thin film 102 that is attached to support structure 106 is referred to herein as the primary supported edge.

Thin film 102 may represent, for example, a thin film in the range of 10-100 nm thick and may be formed of a suitable material such as, for example, Zr or Si. In one or more embodiments, thin film 102 may be a planar structure having parallel planar surfaces. In other embodiments, thin film 102 may be a tapered structure such that the primary supported edge 104 is either thicker or thinner than the opposite edge or may be in the shape of a lens.

In an embodiment, thin film 102 is rectangular or square in shape, and only one edge is attached to a support structure. In another embodiment, thin film 102 may have a different shape than shown (such as for example a non-polygonal shape or a polygon with more than three or four edges).

Figure 2:
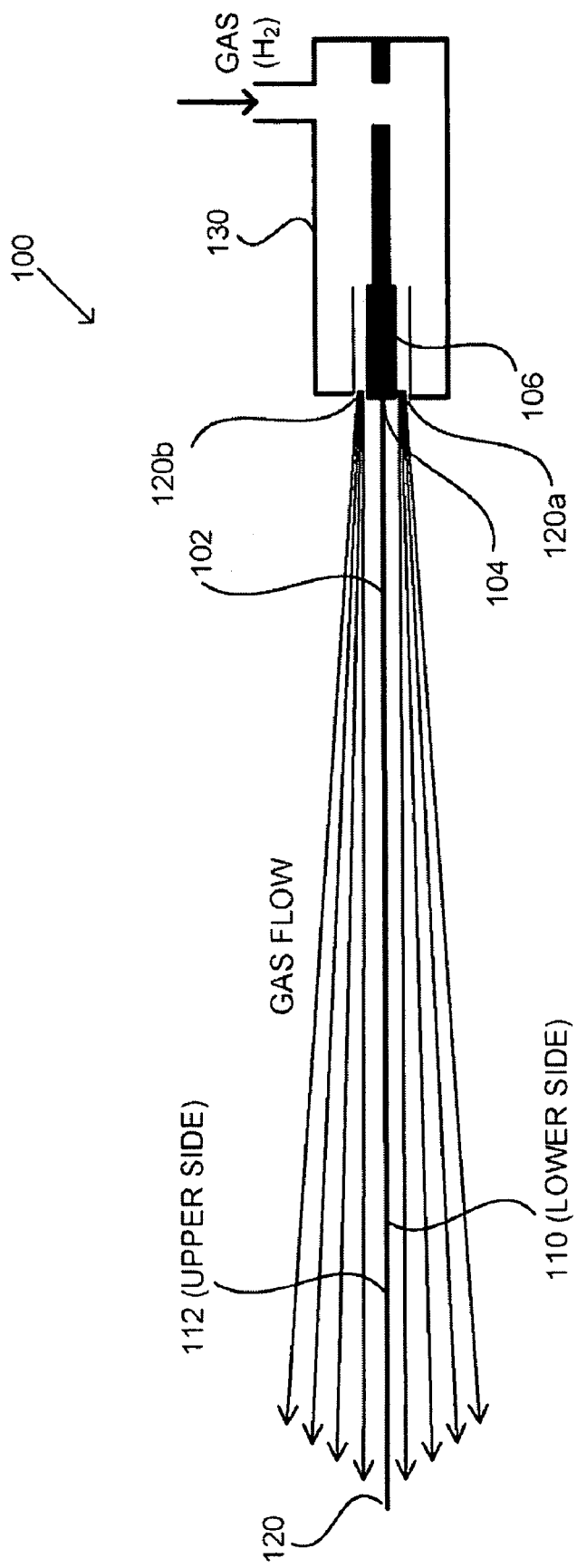
FIG. 2 shows, in accordance with an embodiment, a spectral purity filter disposed in an example operational position.

FIG. 2 shows, in accordance with an embodiment, spectral purity filter 100 disposed in an example operational position, which is substantially horizontal and perpendicular to the direction of gravity. However, such position is not a limitation of the present invention, and the operational position may be at any desired angle. If the operational position is other than vertical, i.e., other than parallel to gravity, support is provided to spectral purity filter 100 in the form of gas flow support provided by gas flow directed along the planar surface or planar surfaces of spectral purity filter 100. For example, a gas may be flowed out of gas port 120a along the lower side 110 of spectral purity filter 100 to provide gas flow support for spectral purity filter 100.

In some embodiments, gas may also be flowed along the upper side 112 of spectral purity filter 100. This gas is shown flowing from gas port 120b in the example of FIG. 2. The angle of incidence of the gas flow may be zero (in which case the gas is flowed substantially parallelly to the plane of the thin film) or may be at some other angle to provide the desired gas flow support. Gas may be flowed from a single slit disposed near the primary-supported edge as shown in the example of FIG. 2 or may be flowed from one or more jets directed along or at the planar surface or surfaces of the thin film.

In one or more embodiments, the gas employed to provide gas flow support for the thin film of the spectral purity filter may be hydrogen, which is present in many EUV lithography systems. However, any gas may be employed without limitation.

In FIG. 2, edge 120 that is opposite primary supported edge 104 is preferably left free, i.e., unattached to a supporting member, so as to avoid disrupting the laminar air flow. Furthermore, the edges that are parallel to the air flow are also left unattached. In this cantilevered arrangement, the spectral purity filter is supported mechanically along the primary supported edge 104 and is supported by gas flow elsewhere. In other embodiments, however, one or more of the remaining edges may be attached to a supporting member, which provides mechanical stiffness for the attached edge(s).

In the example of FIG. 2, support structure 106 is mechanically coupled to a gas manifold 130 that is configured for flowing gas along the lower and upper surfaces of thin film 102. Manifold 130 may in turn be coupled to other support structures of the lithography system. In an embodiment, the gas flow is directed along the axis that connects primary supported edge 104 with opposite edge 120.

Figure 3:
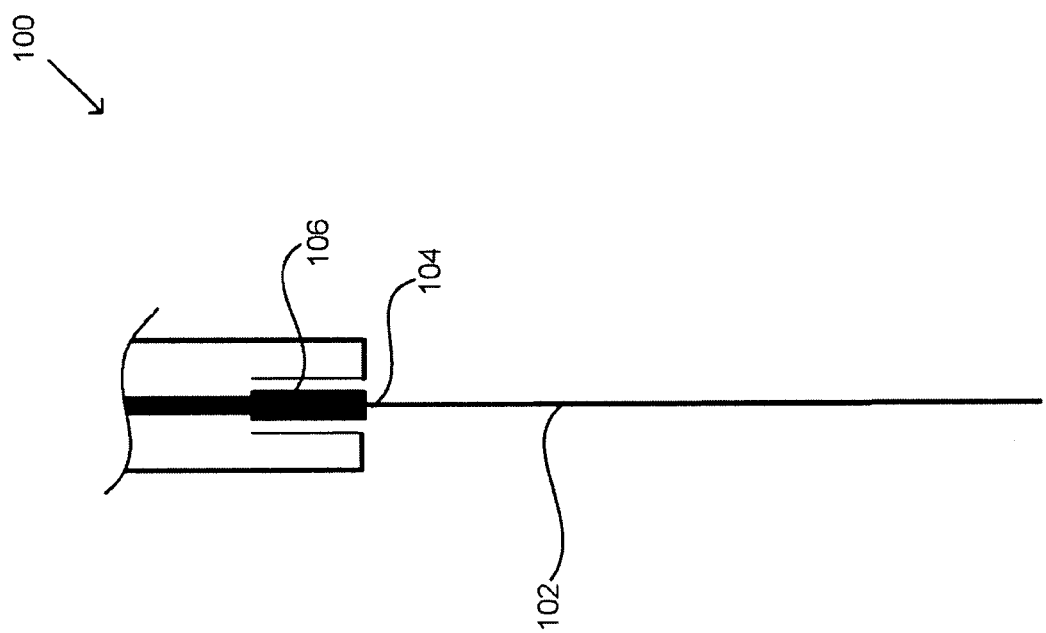
FIG. 3 shows, in accordance with an embodiment, a spectral purity filter in the pre-operational position.

FIG. 3 shows spectral purity filter 100 in the pre-operational position. In this position, supporting structure 106, which is coupled with primary supported edge 104, is connected to the gas manifold (or to other supporting structures of the lithography system). However, since thin film 102 hangs vertically downward and is supported by gravity, gas flow support is unnecessary. As a start-up sequence, gas flow may be provided to facilitate rotating thin film 102 to its operational position (e.g., the horizontal position of FIG. 2). The volume and/or velocity of gas employed for rotating thin film 102 may be varied over time and/or direction (using for example rotatable nozzles) and/or differentiated between the upper and lower surfaces to facilitate smoothly rotating thin film 102 into its operational position. In this case, support structure 106 may be permitted to free pivot to enable the rotation of spectral purity filter 100 into the operational position.

In another example, a rotational force (using for example a motor) may be exerted on support structure 106 to assist in the rotation of spectral purity filter 100 into its operational position. It is preferred, however, that gas flow be provided to provide continuous gas flow support to thin film 102 while rotating and while spectral purity filter 100 is disposed at its operational position.

Figure 4:
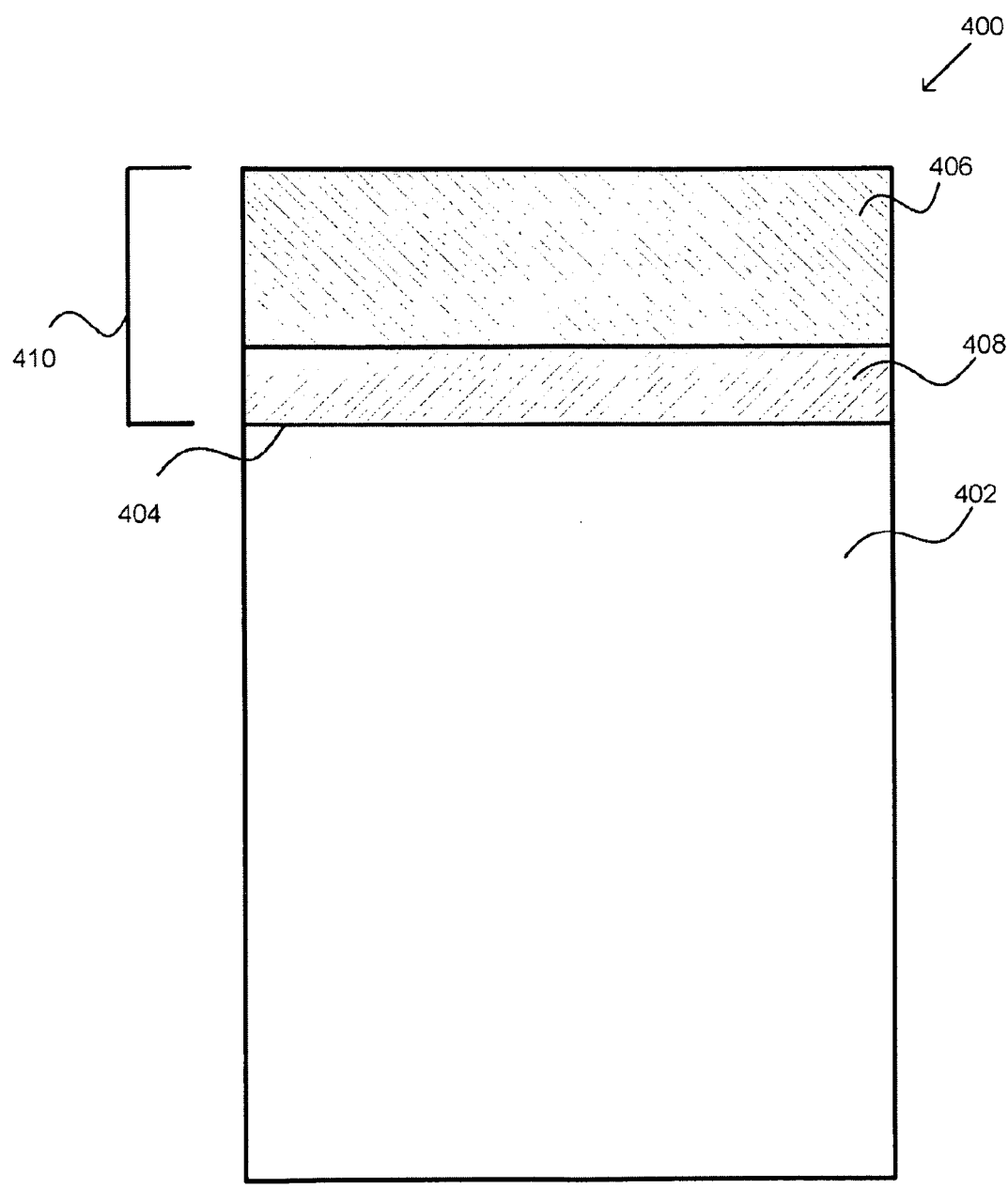
FIG. 4 shows, in accordance with an embodiment of the present invention, a spectral purity filter having a thin film and a support structure that includes a structural member and a flexible member.

FIG. 4 shows, in accordance with an embodiment of the present invention, a spectral purity filter 400 having a thin film 402. Thin film 402 has an edge 404 coupled to a support structure 410 that comprises a flexible member 408 and a structural member 406. In the example of FIG. 4, edge 104 is coupled to flexible member 408, which is in turn coupled to structural member 406. Flexible member 408, which is more flexible than structural member 406, absorbs mechanical vibration and shocks to better protect thin film 402 against mechanical stress. In an example, flexible member 408 represents a flexible membrane such as Mylar and may be attached to thin film 402 using an appropriate adhesive, for example.

While this invention has been described in terms of several preferred embodiments, there are alterations, permutations, and equivalents, which fall within the scope of this invention. Although various examples are provided herein, it is intended that these examples be illustrative and not limiting with respect to the invention.

For example, although the gas that provides gas flow support is shown flowing from slits, it is possible to flow such gas from one or more jets directed along or at the surface(s) of the thin film. As another example, although the gas is shown flowing along the axis that connects the primary supported edge with its opposite edge, the gas that provides the support may be flowed cross-wise or in any other direction as suitable for providing such support. As another example, although Zr and Si are discussed as examples of spectral purity filter thin film material, any suitable spectral purity filter material may be employed.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A spectral purity filter arrangement comprising:
   a film configured for filtering out at least a portion of input light;
   a support structure coupled to said film along at least one edge of said film; and
   at least a first gas port configured to furnish a gas to provide gas flow support for said film at least when said film is disposed in an operational position to perform said filtering.

2. The spectral purity filter arrangement of claim 1 wherein the support structure comprises a structural member and a flexible member that is more flexible than said structural member, said flexible member being coupled between said structural member and said film.

3. The spectral purity filter arrangement of claim 1 further comprising a second gas port also configured to direct said gas at said film, wherein said first gas port and said second gas port are configured to direct said gas at different sides of said film.

4. The spectral purity filter arrangement of claim 1 further comprising a second gas port also configured to direct said gas at said film, wherein said first gas port and said second gas port are configured to direct said gas at different areas of a same side of said film.

5. The spectral purity filter arrangement of claim 1 wherein a volume of said gas is varied over time to facilitate rotating said film from a first position to said operational position, said first position being different from said operational position.

6. The spectral purity filter arrangement of claim 1 wherein a direction of said gas is varied over time to facilitate rotating said film from a first position to said operational position, said first position being different from said operational position.

7. The spectral purity filter arrangement of claim 1 further comprising a motor configured to rotate said film from a first position to said operational position, said first position being different from said operational position.

8. The spectral purity filter arrangement of claim 1 wherein no supporting mesh is present in any area of said film that is employed to perform said filtering.

9. A method for implementing spectral purity filtering in a lithography system, comprising:
   providing a spectral purity filter arrangement comprising:
      providing a film and a support structure, said film configured for filtering out at least a portion of input light and coupled to said support structure along at least one edge of said film; and
   providing a gas configured to provide gas flow support for said film at least when said film is disposed in an operational position to perform said filtering.

10. The method of claim 9 wherein the support structure comprises a structural member and a flexible member that is more flexible than said structural member, said flexible member being coupled between said structural member and said film.

11. The method of claim 9 wherein said gas is provided via at least a first gas port and a second gas port, wherein said first gas port and said second gas port are configured to direct said gas at different sides of said film.

12. The method of claim 9 wherein said gas is provided via at least a first gas port and a second gas port, wherein said first gas port and said second gas port are configured to direct said gas at different areas of a same side of said film.

13. The method of claim 9 further comprising rotating said film from a first position to said operational position, wherein a volume of said gas is varied over time to facilitate said rotating, said first position being different from said operational position.

14. The method of claim 9 further comprising rotating said film from a first position to said operational position, wherein a direction of said gas is varied over time to facilitate said rotating, said first position being different from said operational position.

15. The method of claim 9 further comprising providing a motor configured to rotate said film from a first position to said operational position, said first position being different from said operational position.

16. The method of claim 9 wherein no supporting mesh is present in any area of said film that is employed to perform said filtering.

17. An ultraviolet (UV) lithography system configured for processing substrates, comprising:
- a spectral purity filter film configured for filtering out at least a portion of out-of-band light;
- a support structure coupled to said spectral purity filter film along at least one edge of said spectral purity filter film; and
- means for providing a gas to create gas flow support for said spectral purity filter film at least when said spectral purity filter film is disposed in an operational position to perform said filtering.

18. The UV lithography system of claim 17 wherein the support structure comprises a structural member and a flexible member that is more flexible than said structural member, said flexible member being coupled between said structural member and said spectral purity filter film.

19. The UV lithography system of claim 17 further comprising means for rotating said spectral purity filter density film from a first position to said operational position, said first position being different from said operational position, wherein said spectral purity filter film is supported with said gas flow support while being rotated.

20. The UV lithography system of claim 17 wherein said means for providing said gas comprises a plurality of gas ports.

* * * * *